United States Patent [19]

Rungz

[11] Patent Number: 4,716,338

[45] Date of Patent: Dec. 29, 1987

[54] ELECTRODE STRUCTURE FOR A CATHODE GLOW DISCHARGE SYSTEM

[76] Inventor: Yung Rungz, Room No. 503, 1st door, Beijing Huei Min Hospital Domitory, Beijing, China

[21] Appl. No.: 771,799

[22] Filed: Sep. 3, 1985

[30] Foreign Application Priority Data

May 15, 1985 [CN] China ............................ 85103601

[51] Int. Cl.$^4$ .......................... H01J 17/38; H01J 1/90
[52] U.S. Cl. .................................. 313/619; 174/167; 373/26
[58] Field of Search .................... 313/619, 631, 632; 373/26; 174/140 R, 167, 212

[56] References Cited

U.S. PATENT DOCUMENTS 1,500,789 7/1924 Aoyagi ........................ 313/637 X
3,141,989 7/1964 Jones et al. ....................... 313/619

FOREIGN PATENT DOCUMENTS 521433 3/1931 Fed. Rep. of Germany ...... 313/619

Primary Examiner—David K. Moore
Assistant Examiner—K. Wieder
Attorney, Agent, or Firm—Oblon, Fisher, Spivak, McClelland, & Maier

[57] ABSTRACT

An electrode structure used in a glow discharge system for nitride hardening of metals. The structure includes an anode plate, a cathode plate, a conductor connected to the cathode plate and an insulating dielectric shroud which surrounds the conductor. The two plates are firmly attached to the dielectric shroud so as to prevent any air gaps across which an arc may form. The shroud includes a plurality of annular grooves at one end to prevent the surface of the shroud from being covered by extraneous matter which would allow an arc to form between the plates.

10 Claims, 2 Drawing Figures

ELECTRODE STRUCTURE FOR A CATHODE GLOW DISCHARGE SYSTEM

BACKGROUND OF THE INVENTION

1. Field of the Invention

This invention relates generally to an electrode structure for a glow discharge system and more specifically to an electrode structure in a cathode glow discharge system used for nitride hardening of metals where an insulating shroud is placed between the two electrode plates.

2. Discussion of Background

The hardening of metal is an important technology in many large industries including the manufacture of communications mechanisms, petroleum production and defense systems. One type of hardening which has had great success for many years is the nitride hardening heat treatment process of metals. In this process, the electrode structure of the glow discharge system must be carefully designed in order to prevent problems from arc ignition. Traditionally, an air gap of approximately 1 mm has been used as a shield to prevent an unstable glow discharge from igniting an arc unexpectedly on the electrode structure. While the traditional shielding has been of some use, it has not been totally effective in preventing these arcs.

Some of the early work done in this field was performed by Bernhard Berghous who produced many inventions relating to this field at least as early as the 1930's. Some of these devices are seen in U.S. Pat. Nos. 2,200,909, 2,219,614, 2,219,615, 2,1231,104, 2,266,735, 2,371,278, British Pat. Nos. 520589 and 526527 and German Pat. Nos. 1,044,984, 1,058,806 and 1,156,624. In many of these devices, the traditional shielding method of providing an air gap or a vacuum gap between electrodes is seen. However, as pointed out above, this type of shielding does not always prevent arcs from occurring.

The prior art electrode structures using this form of shielding have been used for several years and it is clear that such arcing has not been completely avoided. Since a great deal of current can be produced by such an arc discharge in a very small area, the density of such current can reach to thousands of amperes. Due to this high current density, great destruction can result to the extent that the furnace used in the process may actually destroy itself. Thus, it is highly desirable to avoid such arcs.

During the nitride hardening process, the voltage drop on the surface of the cathode may be increased to avoid such an arc discharge. As a result, a large number of positive ions formed by this strong electric field bombard the molecules in the region near the cathode at high speed, which causes a primary ionization in the region near the cathode. Positive space charges which are formed in this ionization process in the region away from the cathode produce a very strong voltage gradient toward the cathode. Due to this very strong electric field, the cathode voltage drop is decreased which makes the air gap shield mentioned above to start glowing and fail in its protecting function. As a result, a strong arc discharge is inevitably induced. Thus, damage to the furnace is also inevitable.

Another disadvantage suffered by the prior art devices is overheating caused by the glow lights and the reflected light on the metal parts. As a result of all this light, the frame absorbs a great deal of heat and tries to dissipate the energy. As a result, the electrode structure tends to overheat.

SUMMARY OF THE INVENTION

Accordingly, one object of this invention is to provide a novel electrode structure for a glow discharge system.

Another object of this invention is to provide a novel electrode structure using an insulating shroud for use in a nitride hardening glow discharge device.

A further object of this invention is to provide a novel electrode structure for a glow discharge system without having a large voltage drop and without secondary electron emission near the cathode plate.

A still further object of the present invention is to provide an insulating shroud between the anode and cathode plates of a glow discharge system without gaps.

Another object of the present invention is to provide an insulating shroud between the anode and cathode plates of a glow discharge system which has a plurality of annular grooves along its surface.

Briefly these and other objects of the invention are achieved by providing an insulating shroud which firmly contacts both the anode and cathode plate without having any gaps therebetween. A plurality of grooves are formed around the surface of the shroud near the end toward the cathode so as to prevent a conductive path forming along its surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
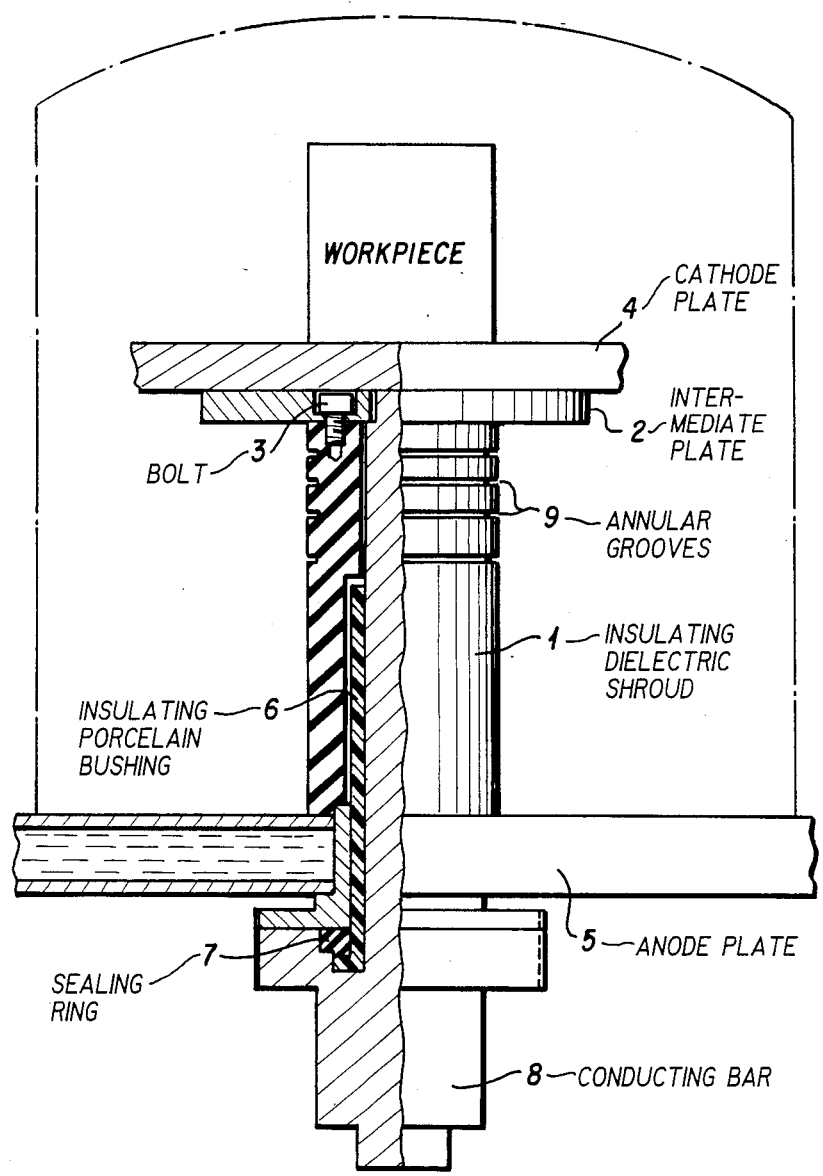
FIG. 1 is a front view, partially cut away, of the construction of the present invention.

Referring now to the drawings, wherein like reference numerals designate identical or corresponding parts throughout the views, and more particularly to FIG. 1 thereof, wherein the electrode structure is shown as including an insulating cylindrical shroud 1. The shroud is made from an insulating material which has the properties of high resistivity and high dielectric strength, low air leakage, tolerance to high temprature, tolerance to high pressure, low thermal coefficient of expansion and mechanical workability. Specifically, the insulating material may be a ceramic or molded mica.

The shroud contains an axial central bore into which a conducting bar 8 passes. The upper end of the shroud is connected to a cathode plate 4 by way of a transferring intermediate plate 2. The conducting bar 8 also contacts cathode plate 4 after passing through a hole in intermediate plate 2. The insulating shroud, intermediate plate and cathode plate are in contact with each other without having any air gap between them. This is insured by the use of bolts 3 which fix the parts together. Even the expansion caused by an increase in temperature will not cause a gap due to use of these bolts.

The shroud includes a plurality of annular grooves 9 on the upper portion of its outer surface. The function of these grooves is to prevent contamination from conductive particulate from settling on the surface of the shroud and causing a short circuit between the plates. This contamination is always present due to substances which spray into the space inside the furnace in the process of forming the glow discharge. When contamination settles on the surface of the shroud, a continuous path is formed which allows a discharge along the surface. By including annular grooves, the continuous path of the contaminant is broken and discharges are much less likely to form.

The anode plate 5 of the electrode structure is connected to the wall of the furnace 10. The shroud 1 rests on top of this plate while the conductive bar 8 passes therethrough. Sealing ring 7 seals the hollow bore of the shroud after the conducting bar is placed therein. This bore inside the shroud forms a vacuum which is maintained by the sealing ring. An insulating bushing 6 separates the anode plate and the connecting bar. A workpiece 11 to be hardened is placed on top of the cathode plate.

In operation, an electrical source is connected to the anode and cathode plates. A normal glow discharge appears on the surface of the cathode plate and on the surface of the workpiece so that the workpiece becomes heated. Since nitrogen has been introduced into the furnace, the hot metal becomes nitride hardened on the workpiece surface.

Figure 2:
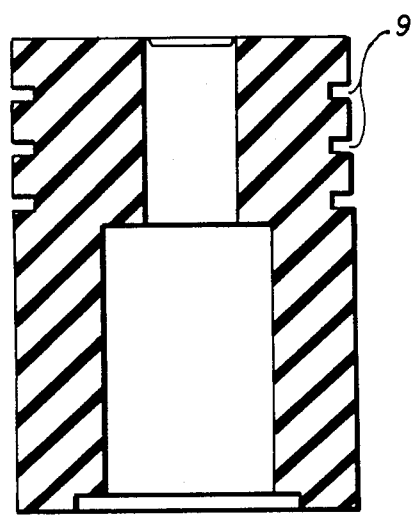
FIG. 2 is a cross-sectional view of the insulating shroud of the present invention.

FIG. 2 shows a cross-sectional representation of the insulating shroud. This device is made of an insulating material such as ceramic or mica. The vertical height of the shroud is equal to the distance between the cathode plate and anode plate, just as shown in FIG. 1. The diameter and form of the axial bore should be made to fit the size and shape of the conducting bar. After the shroud is assembled between the two plates, there are no air gaps at either end. Several annular grooves are formed on the upper portion of the outer surface of the shroud to prevent undesirable discharges along the surface of the shroud.

The metallic parts of the electrode assembly can be made of materials such as chromium steel or $A_3$ steel.

Experiments have shown that the present electrode structure operates in a stable fashion during the glow discharge process when the pressure in the furnace is increased to a value of 10–15 mmHg, and no strong electric field is formed at the junction between the metal and insulating materials with currents up to 10–13 mA/cm$^2$. The present construction in which metal and non-metal materials are in contact operates well over a long period of time, is easy and inexpensive to fabricate. It also does not require cleaning even up to 100 working cycles of the furnace.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electrode structure in a glow discharge system used for nitride hardening of a workpiece, comprising:
   an anode plate;
   a cathode plate mounted opposite said anode plate and adapted to support said workpiece;
   a conducting bar which passes through said anode plate and is connected to said cathode plate;
   an insulating dielectric shroud extending between said anode plate and said cathode plate and surrounding said conducting bar;
   said shroud being in contact with said cathode plate and said anode plate so as to leave no gap therebetween and so that there are no exposed portions of said conducting bar between said cathode and anode plates.

2. An electrode structure according to claim 1, further comprising a plurality of annular grooves formed on the surface of said insulating shroud.

3. An electrode structure according to claim 1, wherein said insulating shroud is made of a high temperature, high dielectric strength insulating material.

4. An electrode structure according to claim 3, wherein said material is ceramic.

5. An electrode structure according to claim 3, wherein said material is mica.

6. An electrode structure according to claim 1, further comprising a transferring plate placed between said cathode plate and said insulating shroud without any gap therebetween.

7. An electrode structure in a glow discharge system used for nitride hardening of a workpiece, comprising:
   an anode plate;
   a cathode plate mounted opposite said anode plate and adapted to support said workpiece;
   an insulative transferring plate in contact with said cathode plate between said cathode plate and said anode plate;
   a conducting bar which passes through said anode plate and said transferring plate and is connected to said cathode plate;
   an insulating dielectric shroud extending between said anode plate and said transferring plate and surrounding said conducting bar;
   an insulating bushing positioned between said conducting bar and said anode plate where said conducting bar passes through said anode plate;
   said insulating shroud being in contact with said anode plate and said transferring plate so as to leave no gap therebetween and so that there are no exposed portions of said conducting bar between said transferring and anode plates.

8. An electrode structure according to claim 7, further comprising a plurality of annular grooves formed on the surface of said insulating shroud.

9. An electrode structure according to claim 7, wherein said insulating shroud is made of a high temperature, high dielectric strength insulating material.

10. An electrode structure according to claim 7 wherein said transferring plate has a thickness of 10–15 cm.

* * * * *